United States Patent [19]
Maeda et al.

[11] Patent Number: 5,381,551
[45] Date of Patent: Jan. 10, 1995

[54] SEMICONDUCTOR INTEGRATED CIRCUIT INCLUDING AN ARBITRATE CIRCUIT FOR GIVING PRIORITY TO A PLURALITY OF REQUEST SIGNALS

[75] Inventors: Shyunji Maeda; Masataka Wakamatsu, both of Kanagawa, Japan

[73] Assignee: Sony Corporation, Tokyo, Japan

[21] Appl. No.: 45,320

[22] Filed: Apr. 7, 1993

Related U.S. Application Data

[63] Continuation of Ser. No. 912,036, Jul. 9, 1992, abandoned, which is a continuation of Ser. No. 377,894, Jul. 10, 1989, abandoned.

[30] Foreign Application Priority Data

Jul. 12, 1988 [JP] Japan .................. 63-172889
Jul. 19, 1988 [JP] Japan .................. 63-179746

[51] Int. Cl.⁶ .................................................. G06F 13/18
[52] U.S. Cl. .................................. 395/725; 364/716; 364/DIG. 1; 364/DIG. 2; 395/325
[58] Field of Search .................. 364/200, 900, 716; 395/375, 728

[56] References Cited

U.S. PATENT DOCUMENTS

| | | | |
|---|---|---|---|
| 3,553,656 | 1/1971 | Bernhardt | 364/206 |
| 3,713,109 | 1/1973 | Hornung | 364/200 |
| 4,130,864 | 12/1978 | Schlotterer | 364/200 |
| 4,138,917 | 2/1979 | Sakashita et al. | 84/1.01 |
| 4,154,133 | 5/1979 | Kitawaga | 84/1.26 |
| 4,189,766 | 2/1980 | Horiguchi et al. | 364/200 |
| 4,238,984 | 12/1980 | Watanabe | 84/1.01 |
| 4,244,018 | 1/1981 | Mui | 364/200 |
| 4,400,771 | 8/1983 | Suzuki et al. | 364/200 |
| 4,403,192 | 9/1991 | Williman | 328/152 |
| 4,523,277 | 6/1985 | Schnathorst | 364/206 |
| 4,620,118 | 10/1986 | Barber | 307/518 |
| 4,814,974 | 3/1989 | Narayanan et al. | 364/200 |
| 4,827,407 | 5/1989 | Nakatami | 364/200 |
| 4,841,178 | 6/1989 | Bisson | 364/200 |
| 4,843,543 | 6/1989 | Isobe | 364/200 |
| 4,866,305 | 9/1989 | Hasegawa | 307/449 |
| 5,039,986 | 8/1991 | Georgiou | 340/825.79 |

FOREIGN PATENT DOCUMENTS

| | | | |
|---|---|---|---|
| 0086671 | 2/1983 | European Pat. Off. | H03K 17/22 |
| 0096531 | 6/1983 | European Pat. Off. | H03K 17/22 |
| 0173769A1 | 3/1986 | European Pat. Off. | G06F 13/14 |
| 60-206319 | 10/1985 | Japan | H03K 3/02 |

OTHER PUBLICATIONS

IBM Technical Disclosure Bulletin, vol. 30, No. 8, Jan. 1988, pp. 367–369, New York, US: "Priority controller for bus arbiter."

Proceedings of the National Computer Conference, New York, 7th–10th Jun. 1976, pp. 777–782, Montvale, US, H. Sechovsky et al.: "Asynchronous speed-independent arbiter in a form of a hardware control module."

*Primary Examiner*—Thomas C. Lee
*Assistant Examiner*—Christopher B. Shin
*Attorney, Agent, or Firm*—Limbach & Limbach

[57] ABSTRACT

An arbitrate circuit prioritizes a plurality of competing request signals by utilizing a plurality of gate circuits to receive a corresponding plurality of request signals. The first gate circuit to receive a request signal passes the request signal and at the same time prevents the remaining gate circuits from passing any request signals until the request signal has completely passed through the first gate circuit.

5 Claims, 11 Drawing Sheets

FIG. 17 PRIOR ART
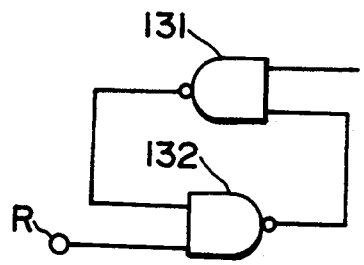
FIG. 19 PRIOR ART
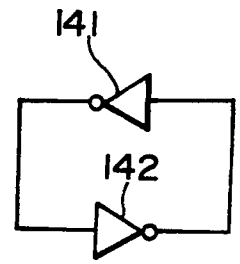
FIG. 18A PRIOR ART
FIG. 18B PRIOR ART
FIG. 18C PRIOR ART
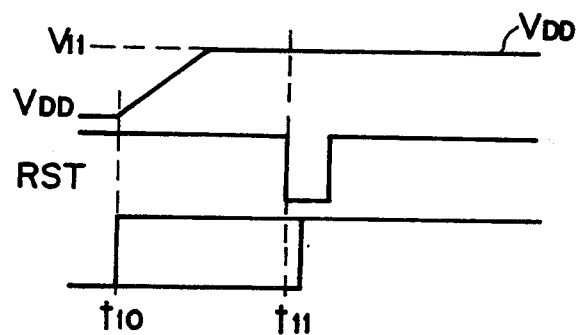
FIG. 20 PRIOR ART
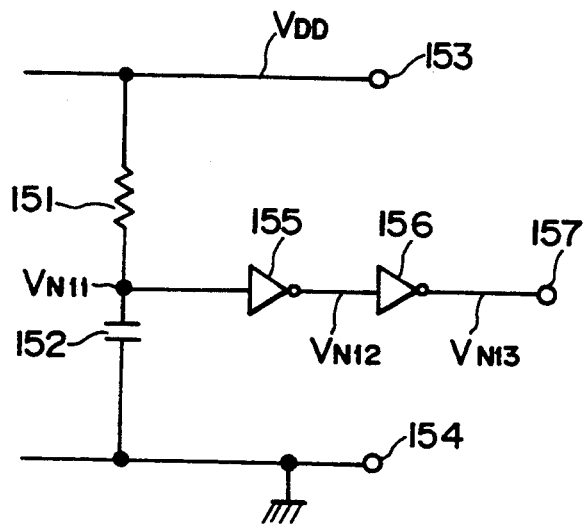

SEMICONDUCTOR INTEGRATED CIRCUIT INCLUDING AN ARBITRATE CIRCUIT FOR GIVING PRIORITY TO A PLURALITY OF REQUEST SIGNALS

This is a continuation of co-pending application Ser. No. 07/912,036 filed on Jul. 9, 1992 which is a continuation of application Ser. No. 07/377,894, filed on Jul. 10, 1989, both now abandoned.

BACKGROUND OF THE INVENTION

1. Field of the Invention

The present invention relates to a semiconductor integrated circuit (IC) including a sequence circuit, such as a shift register circuit, arbitrate circuit or flip-flop circuit, where output is not determined merely by the present input alone and is dependent also on the past hysteresis. More particularly, the invention relates to an arbitrate circuit for sequentially giving proper priority to a plurality of request signals upon occurrence of competitive input of various request signals such as access requests, refresh requests and so forth. And it further relates to a pulse generator circuit for generating, in an IC including a sequence circuit such as an arbitrate circuit, a reset pulse to initialize the sequence circuit at the time of switching on a power source or in response to recovery from a momentary power interruption.

2. Description of the Prior Art

In the conventional semiconductor memory units, there is known a type having two ports as shown in FIG. 9. This exemplary memory unit includes a memory core 91 and is accessible selectively after access requests are outputted respectively from the ports A and B. And when a timing coincidence happens to occur between such access requests, an arbitrate circuit 92 serves to give priority to one access while suspending the other.

FIG. 10 shows the constitution of a conventional arbitrate circuit as a known example. The arbitrate circuit 92 comprises two 2-input AND circuits 93 and 94, wherein each output signal thereof is inverted and fed to one input of the other AND circuit mutually while the remaining inputs receive access requests from the ports A and B respectively, and the individual outputs serve to control the transfer between the ports A, B and the memory core 91.

Describing the operation of such an arbitrate circuit 92 briefly, it is assumed now that initially there exists access requests from the two ports A and B, and both the input and output terminals of the AND circuits 93 and 94 are at a low (L) level. When an access request is received from the port A, the input of the AND circuit 93 is turned to a high (H) level so that the output thereof is changed to a high level. As a result, signal transfer between the port A and the memory core 91 is rendered possible. Meanwhile the output of the AND circuit 93 is inverted and fed to the AND circuit 94. Therefore the output of the AND circuit 94 is turned to a low level, which is kept in such a state despite the arrival of any access request from the port B. That is, the access request from the port B is not accepted unless the preceding access request from the port A is halted.

Although the above-described arbitrate circuit 92 is a type with two ports, the recent further diversity of the memory unit tends to necessitate enhanced arbitration of request signals from 3 or more ports.

However, in the known constitution where gate circuits are arranged in parallel correspondingly to the number of ports and any other gate circuits are merely closed in response to the arrival of a signal from one port, there arises a problem upon the occurrence of competitive input of second, third and following access requests. Suppose here that, during the execution of an access according to a first access request received from one port, a next or second access request is inputted and further a third access request is received. Then, since no priority order is given with regard to the second and third access request signals, there occurs a competitive process at the completion of the first access to eventually fail in achieving the desired arbitration of such signals.

Furthermore, in a sequence circuit such as an arbitrate circuit, shift register circuit, flip-flop circuit or the like whose output is not determined merely by the present input alone and is dependent also on the past hysteresis, the state thereof is rendered unstable at the time of switching on a power source or by any abnormal supply voltage drop caused even for a short time such as momentary power interruption. It is therefore necessary to initialize the sequence circuits in the LSI at the time of switching on the power source or upon receovery from such a momentary power interruption, hence inducing the requirement of a reset pulse generator circuit.

An LSI includes, as shown in FIG. 17 for example, an SR flip-flop consisting of NAND gates 131 and 132. The state of a sequence circuit composed of such an SR flip-flop is not established at the power switch-on time. The SR flip-flop is reset by a reset pulse fed to its reset terminal R.

For attaining the initial state of such SR flip-flop at the power switch-on time, there is provided an external reset pulse generator circuit to output a reset pulse RST as shown in FIG. 18B.

In this external reset pulse generator circuit, a reset pulse RST shown in FIG. 18B is outputted at an instant $t_{11}$ upon the increase of the supply voltage $V_{DD}$ to a predetermined voltage $V_{11}$. Such a reset pulse RST is fed to the reset terminal R of the SR flip-flop consisting of NAND gates 131 and 132, whereby the SR flip-flop is reset.

The state of the SR flip-flop in the LSI is unstable at an instant $t_{10}$ of the power switch-on time, as shown in FIG. 18C. However, the SR flip-flop is reset at an instant $t_{11}$ when such reset pulse RST is outputted, as shown in FIG. 18C.

In the SR flip-flop of FIG. 17 where the reset terminal R thereof is led out, it is resettable by an external reset pulse generator circuit. However, in another flip-flop of FIG. 19 where the output terminal of an inverter 141 is connected to the input terminal of an inverter 142 whose output terminal is connected to the input terminal of the inverter 141, there is not provided any reset terminal so that the flip-flop is not resettable by an external reset pulse generator circuit. Therefore it becomes necessary to incorporate a reset pulse generator circuit in the LSI.

It has been generally customary heretofore that the reset pulse generator circuit incorporated in the LSI is so constituted as shown in FIG. 20.

In FIG. 20, one end of a resistor 151 and one end of a capacitor 152 are connected to each other, and the other end of the resistor 151 is connected to a power supply terminal 153. Meanwhile the other end of the capacitor 152 is connected to a ground terminal 154.

The junction of one end of the resistor 151 and that of the capacitor 152 is connected to an input terminal of an inverter 155, whose output terminal is connected to an input terminal of another inverter 156. And the output terminal of the inverter 156 is connected to an output terminal 157 of the reset pulse generator circuit.

A supply voltage $V_{DD}$ is applied to the power supply terminal 153. In a steady state, the supply voltage $V_{DD}$ has a value $V_{21}$ (e.g. 5 volts) as shown in FIG. 21. When the power source is switched on at an instant $t_{20}$, as shown in FIG. 21, the supply voltage $V_{DD}$ increases from 0 volt to the steady-state voltage $V_{21}$ in conformity with the time constant of the power circuit.

With such rise of the supply voltage $V_{DD}$, the capacitor 152 is charged by the current flowing in the resistor 151, so that the voltage $V_{N11}$ at the junction of the resistor 151 and the capacitor 152 increases with a delay, from the change caused in the supply voltage $V_{DD}$, in accordance with the time constant $C_{152} \cdot R_{151}$ determined by the resistance $R_{151}$ of the resistor 151 and the capacitance $C_{152}$ of the capacitor 152.

The voltage $V_{N11}$ at the junction of the resistor 151 and the capacitor 152 is taken out via inverters 155 and 156. When the voltage $V_{N11}$ at the junction of the resistor 151 and the capacitor 152 has exceeded the threshold voltage $V_{th}$ of the inverter 155, as shown in FIG. 21, the output $V_{N12}$ of the inverter 155 is turned to a low level while the output $V_{N13}$ of the inverter 156 is turned to a high level. Then the output $V_{N13}$ of the inverter 156 is obtained from the output terminal 157 so as to be used as a reset pulse.

Thus, the conventional reset pulse generator circuit incorporated in an LSI is so constituted that the capacitor 152 is charged by the current flowing via the resistor 151, and the voltage $V_{N11}$ at the junction of the resistor 151 and the capacitor 152 is changed with a delay from the change caused in the supply voltage $V_{DD}$, and a reset pulse is outputted when the voltage $V_{N11}$ at the junction of the resistor 151 and the capacitor 152 has exceeded a predetermined threshold value.

However, in such conventional reset pulse generator circuit, the time constant of an integrator consisting of the resistor 151 and the capacitor 152 needs to be greater than that of the power circuit. To the contrary, in case the time constant of the power circuit is greater than that of the integrator consisting of the resistor 151 and the capacitor 152, there arises a problem that a reset pulse is outputted before sufficient rise of the supply voltage $V_{DD}$.

If the time constant of the power circuit for supplying required power to the LSI is greater than the time constant of the integrator consisting of the resistor 151 and the capacitor 152, when the power source is switched on at an instant $t_{30}$ in FIG. 22, the voltage $V_{N11}$ at the junction of the resistor 151 and the capacitor 152 is changed substantially simultaneously with the change in the supply voltage $V_{DD}$. As a result, the output of the inverter 155 is turned to a low level at an instant $t_{31}$ where the supply voltage $V_{DD}$ has not risen to a sufficiently high voltage, so that the output of the inverter 156 is turned to a high level to consequently reset the sequence circuit in the LSI.

Thus, in the case that the time constant of the power circuit is greater than that of the integrator consisting of the resistor 151 and the capacitor 152, the change in the voltage $V_{N11}$ at the junction of the resistor 151 and the capacitor 152 becomes substantially simultaneous with the change in the supply voltage $V_{DD}$, so that there arises a problem of generating a reset pulse before a complete increase of the supply voltage $V_{DD}$.

In view of the above problem, there may be contrived a means of selecting, as compared with the time constant of the power circuit, a sufficiently greater time constant of the integrator which consists of the resistor 151 and the capacitor 152. However, some limits are practically existent with regard to the resistance of the resistor and the capacitance of the capacitor attainable in the LSI. Accordingly, in case the integrator is composed of a resistor 151 and a capacitor 152 in the LSI, it is impossible to select a sufficiently great time constant of the integrator consisting of the resistor 151 and the capacitor 152.

Therefore, in attaining selection of a sufficiently great time constant relative to the integrator of the resistor 151 and the capacitor 152, it becomes necessary to provide the resistor 151 and the capacitor 152 externally. However, such external provision of the resistor 151 and the capacitor 152 brings about another problem of increasing the circuit scale.

Besides the above, in the case that the time constant of the integrator consisting of the resistor 151 and the capacitor 152 is selected to be greater than that of the power circuit for supplying required power to the LSI, a further problem arises that the sequence circuit in the LSI is not resettable upon restoration of the normal power supply after any momentary power interruption.

That is, when a momentary power interruption occurs at an instant $t_{41}$ in FIG. 23, the supply voltage $V_{DD}$ drops in conformity with the time constant of the power circuit and finally becomes 0 volt at an instant $t_{42}$. Since the state of the sequence circuit in the LSI is thus unstable after occurrence of such momentary power interruption, the sequence circuit needs to be reset posterior to restoration of the normal power supply.

Upon occurrence of a momentary power interruption, the voltage $V_{N11}$ at the junction of the resistor 151 and the capacitor 152 is changed very gently as shown in FIG. 23 if the time constant thereof is sufficiently great.

And after such momentary power interruption, the normal power supply is restored at an instant $t_{43}$ before the voltage $V_{N11}$ at the junction of the resistor 151 and the capacitor 152 drops to a predetermined value. Consequently, no change is caused in the output voltage $V_{N12}$ of the inverter 155 or the output voltage $V_{N13}$ of the inverter 156 either, whereby the sequence circuit in the LSI fails to be reset after restoration of the normal power supply.

OBJECTS AND SUMMARY OF THE INVENTION

The present invention has been accomplished in view of the technical problems mentioned above. And its object resides in providing an improved arbitrate circuit In a semiconductor integrated circuit (IC) including a sequence circuit such as an arbitrate circuit for sequentially giving proper priority to a plurality of request signals upon occurrence of competitive input of such signals, the feature of the present invention resides in the provision of gate circuits arrayed in the form of a matrix with N rows and N−1 columns, gate closing circuits for closing the gate circuits in the other rows and the same column, gate opening circuits for opening the closed gate circuits in the other rows and the preceding column, and gate holding circuits for holding the signals to the gate circuits in the same row and the previous columns, thereby processing three or more request signals in sequence.

According to one aspect of the present invention, there is provided an arbitrate circuit included in a semiconductor IC for sequentially giving proper priority to a plurality of request signals upon occurrence of competitive input of such request signals to N input terminals (where N is a natural number greater than 3), the arbitrate circuit comprising N input terminals, N output terminals, gate circuits arrayed to form a matrix with N rows and N−1 columns in such a manner that N−1 gate circuits are connected in series between the N input and output terminals respectively, gate holding circuits driven in response to passage of a signal through any one gate circuit and holding, until completion of input of the signal, the other signals to the gate circuits in the same row and the previous columns, gate closing circuits driven in response to passage of a signal through any one gate circuit and closing, until completion of input of the signal, the gate circuits in the other rows and the same column except the gate circuit where the signal is held by the gate holding circuit, and gate opening circuits driven in response to passage of a signal through any one gate circuit and opening the closed gate circuits in the other rows and the preceding column.

BRIEF DESCRIPTION OF THE DRAWINGS

FIG. 17 is a block diagram of an exemplary sequence circuit;

FIGS. 18A–18C is a graphic waveform chart for explaining the operation of a conventional external pulse generator circuit;

FIG. 19 is a block diagram of another exemplary sequence circuit;

FIG. 20 is an exemplary connection diagram of a conventional internal pulse generator circuit.

DESCRIPTION OF THE PREFERRED EMBODIMENTS

Figure 2:
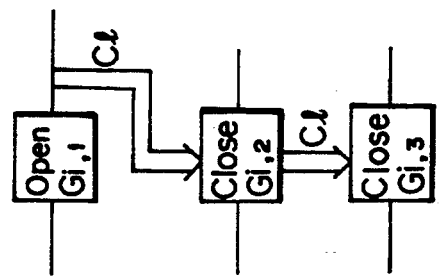
FIG. 2 schematically illustrates the function of gate closing circuits in the arbitrate circuit of the invention.
Figure 1:
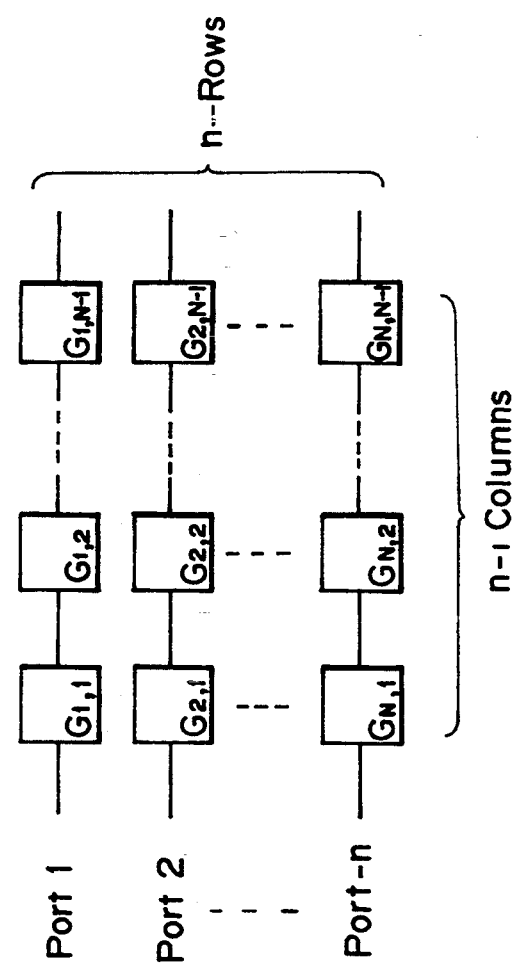
FIG. 1 schematically shows an exemplary gate array in an arbitrate circuit according to the present invention.
Figure 3:
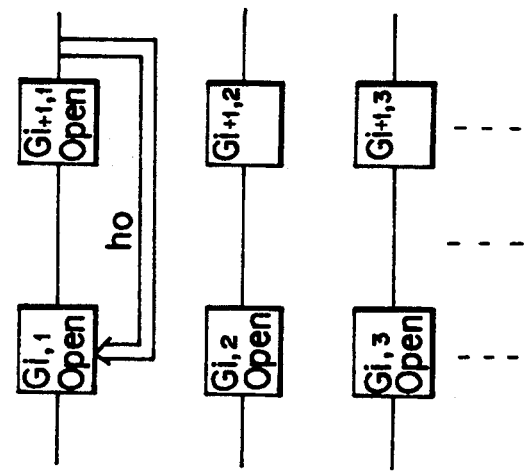
FIG. 3 schematically illustrates the function of gate opening circuits in the arbitrate circuit of the invention.
Figure 4:
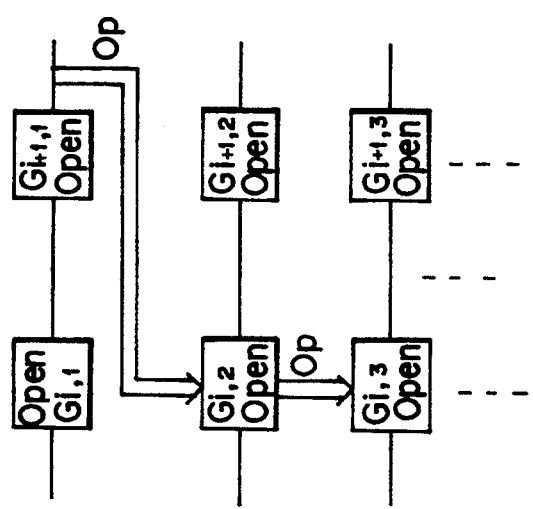
FIG. 4 schematically illustrates the function of gate holding circuits in the arbitrate circuit of the invention.

The arbitrate circuit of the present invention will be described below with reference to FIGS. 1 through 4 which schematically illustrate the concept of the invention. In the arbitrate circuit of the invention, gate circuits $G_{i,j}$ (i=natural number out of 1 to N; j=natural number out of 1 to N−1) are arrayed in the form of a matrix with N rows and N−1 columns as shown in FIG. 1, wherein N−1 gate circuits are connected in series between N (=natural number greater than 3) input and output terminals respectively. To such gate circuits, as shown in FIGS. 2 through 4, there are connected gate closing circuits C1, gate opening circuits Op and gate holding circuits Ho (sometimes referred to herein as blocking circuits). As shown in FIG. 2, the gate closing circuits C1 are driven in response to passage of a signal through any one gate circuit and close the gate circuits in the other rows and the same column. Although the gate closing circuits C1 thus function to close the gate circuits in the other rows and the same column, such a closing operation is not performed for a row being held by the gate holding circuits Ho. And the closing operation is maintained until completion of input of the signal (e.g. until halt of the process request). As shown in FIG. 3, the gate opening circuits Op are driven in response to passage of a signal through any one gate circuit and function to open the closed gate circuits in the other rows and the preceding column. In this case, the preceding column signifies the column immediately before the aforesaid one gate circuit. Furthermore, as shown in FIG. 4, the gate holding circuits Ho are driven in response to passage of a signal through any one gate circuit and function to hold the other signals to the gate circuits in the same row and the previous columns. Here the previous columns signify those from the first column to the preceding column. The gate holding circuits Ho perform the operation to cope with the gate closing operation and may be provided for the individual columns. Such holding operation is maintained continuously until completion of input of the signal.

The arbitrate circuit of the present invention comprises gate circuits arranged in N rows each composed of series-connected N−1 gate circuits, wherein a received signal is outputted after successive passage through the entirety of the series-connected N−1 gate circuits. During the signal passage through each gate circuit, the gate circuits in the other rows and the same column are closed by the gate closing circuits, and simultaneously the gate circuits in the other rows and the preceding column are opened from the closed state by the gate opening circuits. Consequently, upon complete passage of the signal through the gate circuit in the (i)th row and the (j)th column, the gate circuits in the (j)th column in any other rows than the (i)th row are closed, while the gate circuits in any other rows than the (i)th row and in the (j−1) th column are opened. The signal thus passed through the gate circuits in the (j−1)th column in the (i)th row is then forwarded to the next gate circuit in the (i)th row and the (j+1)th column. If the gate circuit in the (i)th row and the (j+1)th column has already been closed by a preceding input signal, the present input signal is brought to a halt in the state where the gate circuits in the (j)th column any other rows than the (i)th row are closed, and the signal is not forwarded any further than the gate circuit in the (j)th column. And after completion of the preceding input signal, the gate circuit in the (i)th row and the (j+1)th column is opened from the closed state to permit advance of the request signal to the (j+1)th column.

The gate holding circuit serves to protect the previously signal from a from closure of the gate circuit, so that the gate circuit in the row relevant to the preceding signal is not closed by any of the following input signals. Thus, when the input and output terminals are concerned with N rows, N−1 required data are sufficient to determine the priority order. Therefore, in a constitution where the gate circuits are arrayed in the form of a matrix consisting of N rows and N−1 columns, each of the N−1 columns has information relative to the order of the input signals, and the priority order of the second and the following is determined by the condition of the signal in each row in each of the columns.

Hereinafter preferred embodiments of the present invention will be described with reference to the accompanying drawings.

First Embodiment

Figure 5:
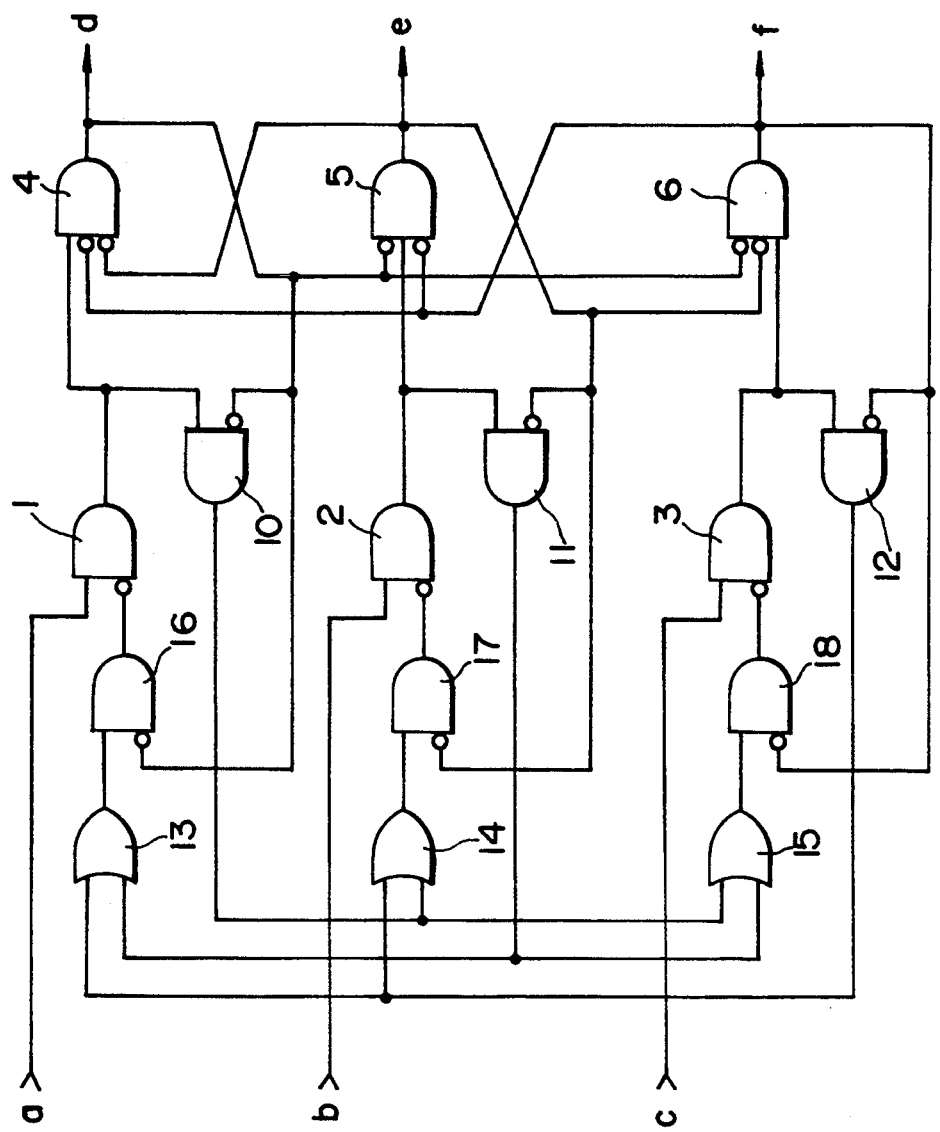
FIG. 5 is a circuit diagram of a first embodiment of the invention.

A first exemplary arbitrate circuit embodying the invention is so constituted as shown in FIG. 5, wherein gate circuits are arrayed in the form of a matrix consisting of 3 rows and 2 columns (N=3) to arbitrate access requests from the ports of three systems.

Explaining first the circuit configuration, as shown in FIG. 5, there are provided gate circuits 1 and 4 connected in series between an input terminal a and an output terminal d; gate circuits 2 and 5 connected in series between an input terminal b and an output terminal e; and gate circuits 3 and 6 connected in series between an input terminal c and an output terminal f. The gate circuits 1, 2, 3 constitute a first column; while the gate circuits 4, 5, 6 constitute a second column. Such gate circuits 1 through 6 serve as AND circuits and the input terminals thereof which are not connected in series with one another are inverse input terminals.

Relative to such gate circuits arrayed to form a 3-row, 2-column matrix, gate closing circuits are provided for feeding back the outputs of the relevant gate circuits and thereby closing the gate circuits in the other rows and the same column. In this embodiment, OR circuits 13, 14, 15 function as gate closing circuits for the gate circuits 1, 2, 3 respectively. The individual two inputs of the OR circuits 13, 14, 15 are obtained via AND circuits 10, 11, 12, which function as gate opening circuits as will be described later, from the outputs in the other rows and the same column. That is, the OR circuit 13 receives the outputs of the gate circuits 2 and 3; the OR circuit 14 receives the outputs of the gate circuits 1 and 3; and the OR circuit 15 receives the outputs of the gate circuits 1 and 2. Due to such connections, when the output of any one gate circuit has a high (H) level, the related closing circuit functions to close the gate circuits in the same column and the other rows. The terminals of the gate circuits 1, 2, 3 for receiving signals respectively from the OR circuits 13, 14, 15 are inverse input terminals connected thereto via AND circuits 16, 17, 18. Although depending on another input level also, the gate circuit 1 is closed when the output of the OR circuit 13 is turned to a high level; the gate circuit 2 is closed when the output of the OR circuit 14 is turned to a high level; and the gate circuit 3 is closed when the output of the OR circuit 15 is turned to a high level. Meanwhile the gate circuits 4–6 are equivalent to the aforementioned gate circuits 1–3 with the exception of the AND circuits 10–12 and 16–18 connected thereto. In the gate circuits 4–6, inverted inputs are fed to the terminals thereof except those connected in series to one of the gates 1, 2 or 3, respectively, and such inverted inputs are the outputs from the other rows and the same column. Therefore, the gate circuits 5 and 6 are closed when the output of the gate circuit 4 is turned to a high level; the gate circuits 4 and 6 are closed when the output of the gate circuit 5 is turned to a high level; and the gate circuits 4 and 5 are closed when the output of the gate circuit 6 is turned to a high level. Since this column is the final stage, it is not affected by the next column. Consequently, there exists no necessity of providing any gate opening circuits or gate holding circuits such as the AND circuits 10–12 or 16–18, respectively.

The gate opening circuits operate in response to passage of a signal through any one gate circuit and open the closed gate circuits in the other rows of the preceding column. In this embodiment, the AND circuits 10–12 have such function. These AND circuits 10–12 are interposed between the respective input terminals of the gate closing circuits so as to serve as switches. The output of the gate circuit 4 is fed back to the AND circuit 10; the output of the gate circuit 5 is fed back to the AND circuit 11; and the output of the gate circuit 6 is fed back to the AND circuit 12. For example, when the output of the gate circuit 4 is turned to a high level, it is inversely inputted to the AND circuit 10. Therefore the output of the AND circuit 10 is turned to a low level, and such low-level signal is then supplied to the OR circuits 14 and 15 to consequently open the closed gate circuits 2 and 3. The above operation is performed similarly with regard to the AND circuits 11 and 12 as well.

The gate holding circuits operate in response to passage of a signal through any one gate circuit and hold other signals to the other gate circuit in the same row and the preceding column until completion of input of the first signal. More specifically, at the signal input time, the signals from the gate closing circuits 13–15 are interrupted by means of the AND circuits 16–18. Both the output of the OR circuit 13 and the inverted output of the gate circuit 4 are fed to the AND circuit 16, whose output is then inverted and fed to the gate circuit 1. The output of the OR circuit 14 and the inverted output of the gate circuit 5 are fed to the AND circuit 17, whose output is then inverted and fed to the gate circuit 2. Meanwhile the output of the OR circuit 15 and the inverted output of the gate circuit 6 are fed to the AND circuit 18, whose output is then inverted and fed to the gate circuit 3. Due to these connections, the output of the OR circuit 13 is interrupted by the AND circuit 16 when the output of the gate circuit 4 is turned to a high level, so that the gate circuit 1 is not placed in its closed state despite an input of a second signal to any other row.

Figure 7:
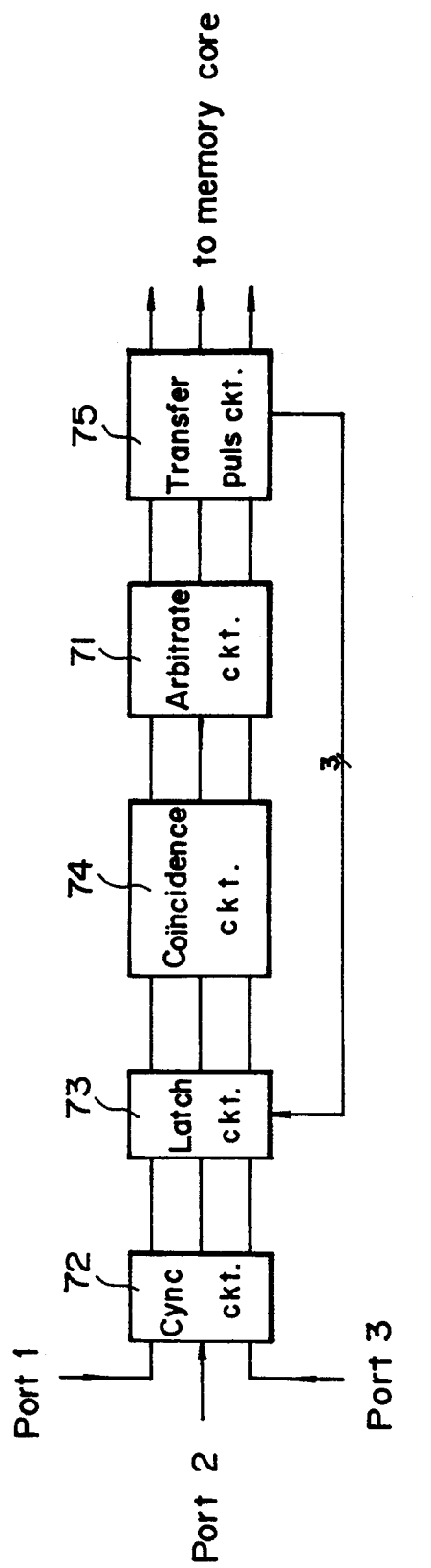
FIG. 7 is a block diagram of an exemplary system employing the arbitrate circuit of the invention.

The arbitrate circuit of the constitution mentioned above may be employed as a component of, for example, a memory unit shown in FIG. 7. The circuit configuration of FIG. 7 is designed for arbitrating access requests from three input/output ports to a memory core. The access request signals received from the three ports are inputted to a synchronizing circuit 72, where each of the access request signals is synchronized with the period of clock pulses by a flip-flop or the like. Subsequently the access request signals are fed to a latch circuit 73. In this example, the latch circuit consists of a J-K flip-flop where its K terminal serves to receive the signal from the synchronizing circuit 72 while its J terminal serves to receive the signal from a transfer pulse circuit 75. Therefore the latch circuit is initialized after generation of a transfer pulse. The output of the latch circuit 73 is fed to a coincidence circuit 74, which may be so formed as to cause slight delays mutually among three signal lines in case the pulses are inputted at the same timing in such signal lines. For example, in case the signal from the port 1 is not delayed, the signals from the ports 2 and 3 are delayed for ⅓ and ⅔ clock periods, respectively. Thus, it becomes possible to prevent that the pulses from three signal lines are fed exactly at the same timing to the arbitrate circuit 71. When there occurs competitive input of access requests from the individual ports, the arbitrate circuit 71 is capable of sequentially giving priority to the access requests to achieve successive accesses as will be described later. An exemplary constitution of such an arbitrate circuit 71 is shown in FIG. 5. The access request signals thus arbitrated are fed to the transfer pulse circuit 75, which then produces output signals to control the transfer gates between the memory core and the individual ports. For example, when one of the output signals of the transfer pulse circuit 75 is turned to a high level, the signal transfer is rendered possible between the memory core and the port relevant to such signal.

Now the operation of the arbitrate circuit shown in FIGS. 5 and 7 will be described below with reference to FIG. 6.

It is premised here that the input terminals a, b, c in FIG. 5 are connected to the coincidence circuit 74 shown in FIG. 7, and the output terminals d, e, f in FIG. 5 are connected to the transfer pulse circuit 75 shown in FIG. 7. It is also supposed that the entire gates of the arbitrate circuit are initially in a low-level state. Assume now that access requests are received from the three ports exactly simultaneously. Then the three access signals are synchronized with the clock period by the synchronizing circuit 72 and are fed simultaneously to the coincidence circuit 74 via the latch circuit 73. In the coincidence circuit 74, there are caused no delay to the terminal a, ⅓ clock delay to the terminal b, and ⅔ clock delay to the terminal c, respectively.

Figure 6:
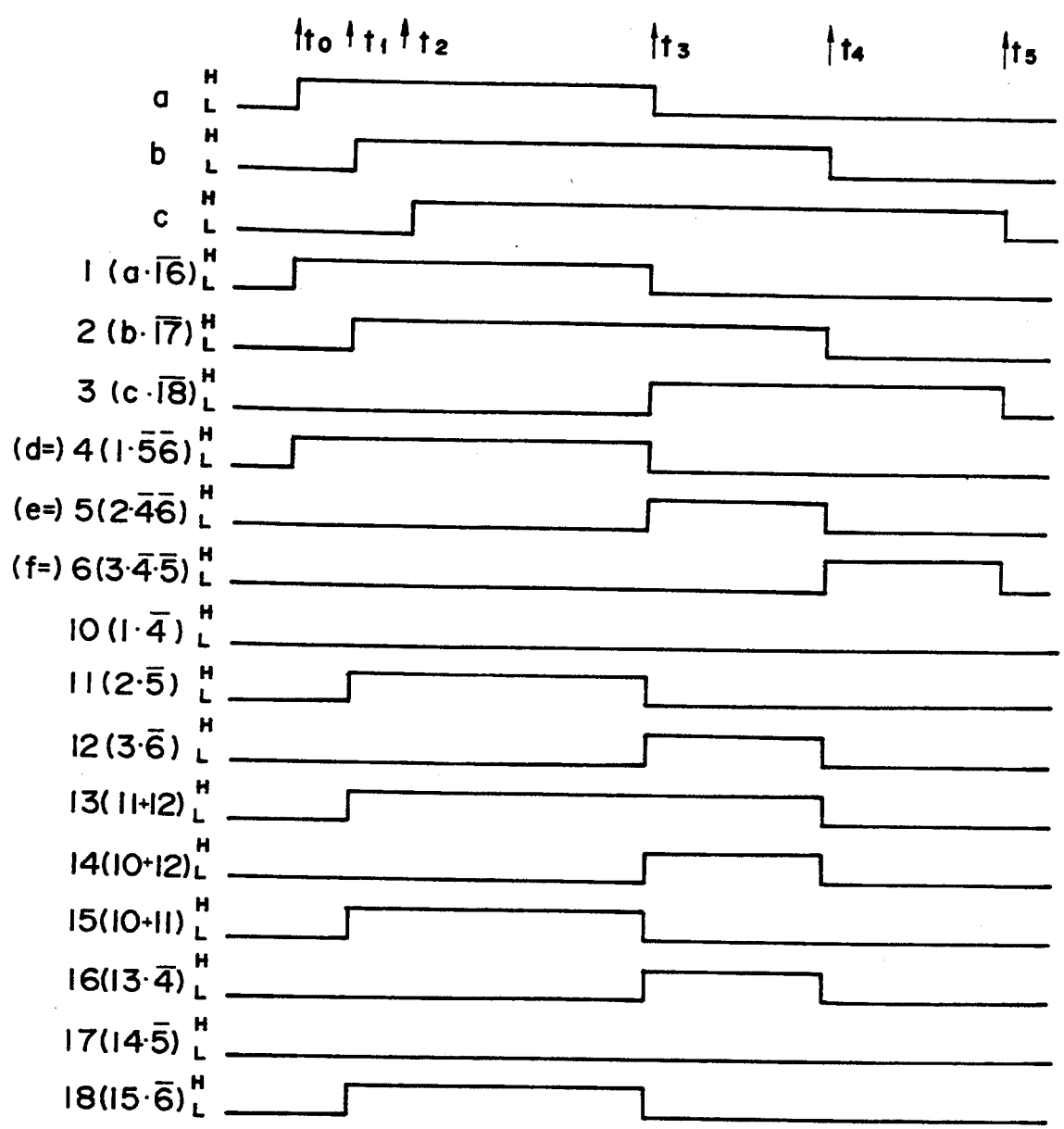
FIG. 6 is a timing chart of signals for explaining the operation in the arbitrate circuit of the invention.

FIG. 6 is a timing chart of such input signals. In the arbitrate circuit, the signal at the terminal a is changed from a low level to a high level at an instant $t_0$. As a result, the output of the gate circuit 1 is turned to a high level so that the output of the gate circuit 4 is also turned to a high level. Consequently, first the signal at the terminal d is turned to a high level and is outputted as an access request from the arbitrate circuit. During such process, the output of the gate circuit 1 is turned to a high level so that, in the first column, the gate circuits 2 and 3 are closed via the AND circuit 10 and the OR circuits 14, 15 merely for an extremely short time and then are opened immediately by the feedback output of the gate circuit 4. Meanwhile, as the output of the gate circuit 4 is turned to a high level, the inverse inputs of the gate circuits 5, 6 are at a high level to consequently place the gate circuits 5, 6 in a closed state. Furthermore the signal from the gate circuit 4 is also inverted and fed to the AND circuit 16 whose output remains unchanged at a low level, so that the output of the gate circuit 1 is not inverted despite inversion of the output of the OR circuit 13.

At a next instant $t_1$ after the lapse of a ⅓ clock delay, the access request from the other port is inputted to the terminal b. Since the gate circuit 2 has already been opened at this instant, the output of the gate circuit 2 is turned to a high level. However, the output of the gate circuit 5 is not turned to a high level as it is closed by the signal from the gate circuit 4. That is, there occurs a state where the access request signal is halted in the preceding column. When the signal from the gate circuit 2 is turned to a high level, the output of the AND circuit 11 is also changed to a high level to consequently turn the outputs of the OR circuits 13 and 15 to a high level. The output of the OR circuit 13 serves to close the gate circuit 1 via the AND circuit 16, but in this stage the output of the AND circuit 16 has already been set to a low level by the signal from the gate circuit 4, whereby the high-level signal from the OR circuit 13 is not permitted to reach the gate circuit 1. Meanwhile the high-level output of the OR circuit 15 is fed to the gate circuit 3 via the AND circuit 18, thereby closing the gate circuit 3.

Subsequently a high-level signal is fed to the terminal c at an instant $t_2$. However, since the gate circuit 3 has already been closed at the instant $t_1$, no change is caused in the gate circuit despite any high-level input to the terminal c.

Assume now that, at a next instant $t_3$, the signal to the terminal a is turned from a high level to a low level. Then the output of the gate circuit 1 is changed from a high level to a low level, and similarly the output of the gate circuit 4 is also turned to a low level. Due to such output change of the gate circuit 4 to a low level, the output of the AND circuit 16 is turned to a high level to consequently close the gate circuit 1. Meanwhile the gate circuits 5 and 6 are opened from the closed state and, since the output of the gate circuit 2 has already been turned to a high level, first the output of the gate circuit 5 is turned to a high level. It follows therefore that the access request signal from the next port is outputted from the terminal e. The gate circuits 4 and 6 are closed in accordance with the output change of the gate circuit 5 to a high level. And the output of the AND circuit 11 is turned to a low level due to such output change of the gate circuit 5 to a high level. In this stage of the operation, the output of the AND circuit 17 remains at a low level. And since the outputs of the AND circuits 10 and 11 are both at a low level, the output of the OR circuit 15 becomes a low level. As a result, the output of the AND circuit 18 is changed from a high level to a low level to consequently open the gate circuit 3 from the closed state. Accordingly the output of the gate circuit 3 is turned to a high level while the output of the AND circuit 12 is changed from a low level to a high level, so that the outputs of the OR circuits 13 and 14 are also changed to a high level (with the output of the OR circuit 13 remaining at a high level). In a state immediately after the instant $t_3$, the access request from the terminal c is kept waiting in the first-row gate circuit differently from the preceding state.

The access request signal inputted to the terminal b is completed at a next instant $t_4$. As a result, the outputs of the gate circuits 2 and 5 are turned to a low level to consequently open the gate circuits 4 and 6. Then, since the output of the gate circuit 3 has already been turned to a high level, the output of the gate circuit 6 is changed from a low level to a high level, whereby the gate circuits 4 and 5 are placed in a closed state. In this stage, the signal from the terminal f is turned to a high level so that a transfer pulse is generated on the basis of the access request inputted to the third port. Meanwhile the output of the AND circuit 12 is changed from a high level to a low level. As a result, the outputs of the OR circuits 13 and 14 are both changed from a high level to a low level, and also the output of the AND circuit 16 is changed to a low level. Such change of the outputs of the OR circuits 13 and 14 to a low level signifies that the gate circuits 1 and 2 in the closed state are opened, whereby each of the terminals a and b is rendered ready to receive the next access request signal.

At an instant $t_5$, the signal from the terminal c is turned to a low level to consequently change the outputs of the gate circuits 3 and 6 to a low level. Since any successive access request signal is not inputted, the gate circuits are placed in a standby state to wait for arrival of next access request signals.

Thus, in the above-described embodiment of the arbitrate circuit, proper priority is given sequentially to each of the first, second and third input access request signals with certainty to eventually enable accurate transfer of the signals between the ports and the memory core.

Second Embodiment

A second exemplary arbitrate circuit embodying the invention has a 4-row 3-column gate array and is capable of arbitrating access requests from, for example, four ports. This example is accomplished by modifying the constitution of the aforementioned first embodiment to form a gate array with 4 rows and 3 columns.

Figure 8:
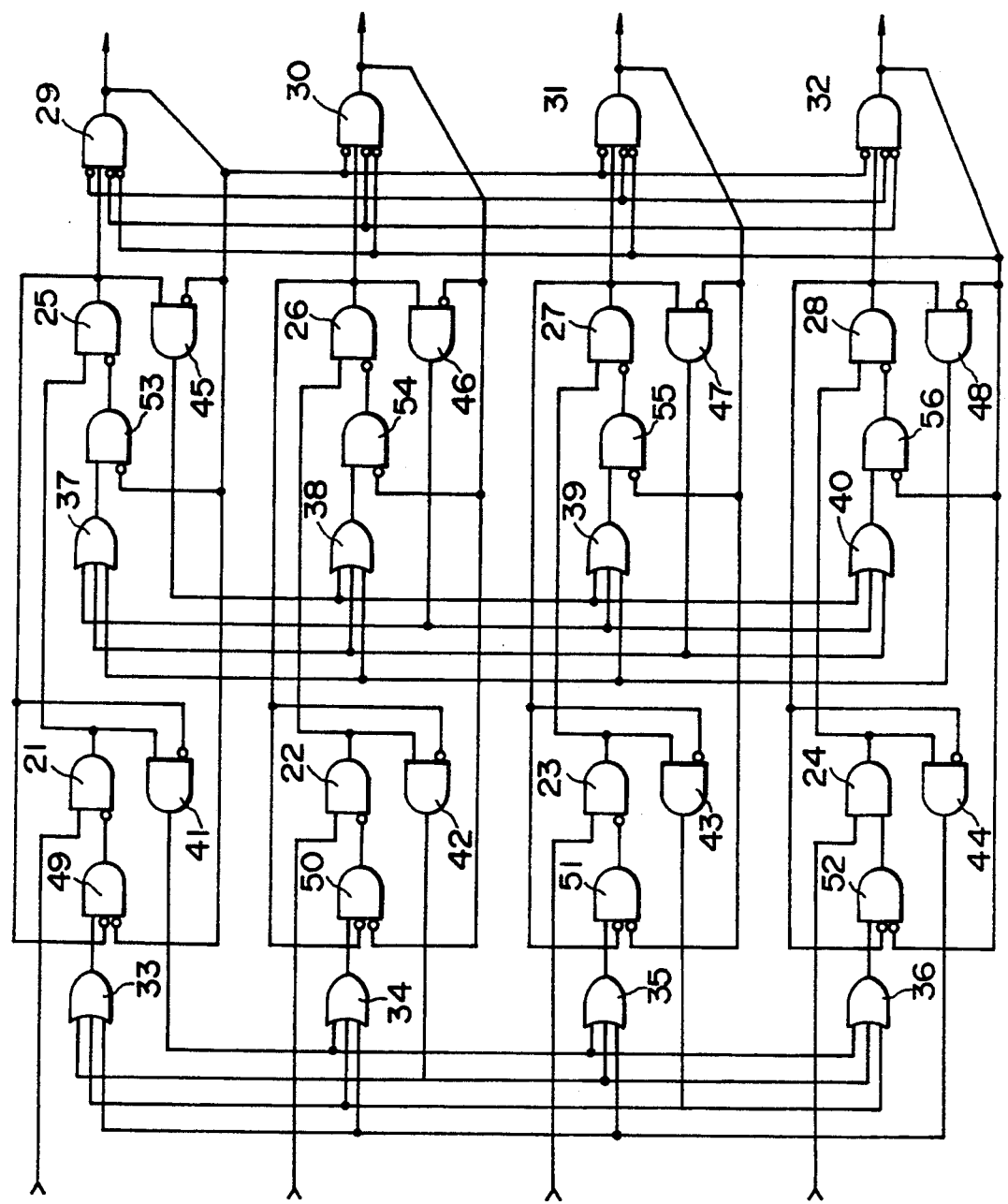
FIG. 8 is a circuit diagram of a second embodiment of the invention.
Figure 10:
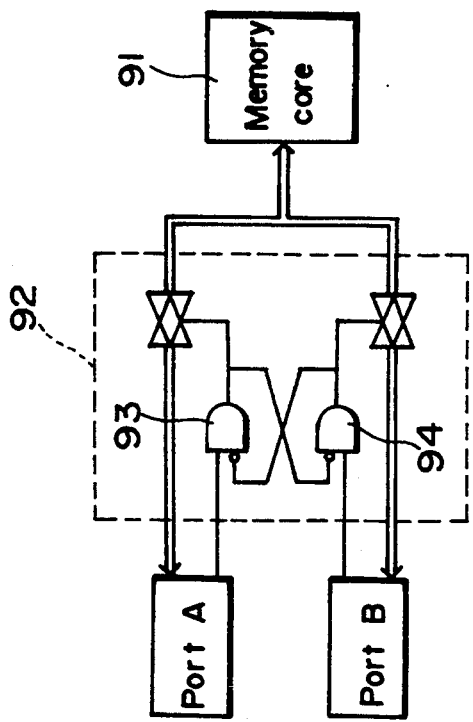
FIGS. 9 and 10 are block diagrams of general arbitrate circuits.
Figure 9:
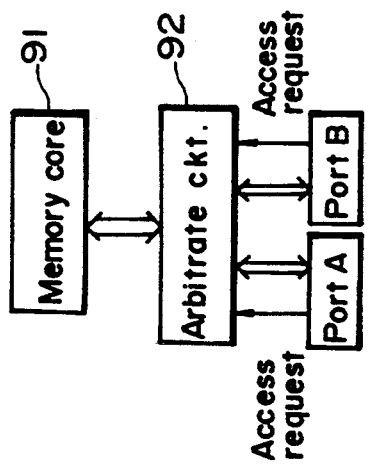

Describing its constitution with reference to FIG. 8, gate circuits 21–32 are arrayed in the form of a matrix with 4 rows and 3 columns. The first row consists of gate circuits 21, 25, 29; the second row consists of gate circuits 22, 26, 30; the third row consists of gate circuits 23, 27, 31; and the fourth row consists of gate circuits 24, 28, 32. Gate closing circuits comprise OR circuits 33–40, a circuit arrangement for feeding inverted signals to the gate circuits 29–32 in the third column, and wiring to the gate circuits 21–32 in the other rows and the same column. Meanwhile gate opening circuits principally comprise AND circuits 41–48; and gate holding circuits principally comprise AND circuits 49–56. In particular, each of the AND circuits 49–52 has two inverse input terminals and is capable of holding an access request signal even when such signal is existent in the second column as well as in the first column. The relationship of connection is similar to that in the aforementioned first embodiment, but the number of required connecting wires for the gate opening circuits becomes greater due to the 4-row 3-column array.

In the second embodiment of the arbitrate circuit having such constitution, desired arbitration is possible with respect to 4-row parallel pulse inputs, and proper priority can be given sequentially to the second through fourth access requests.

The first and second embodiments of the present invention have been mentioned hereinabove with regard to exemplary 3-row 2-column and 4-row 3-column gate arrays, respectively. However, it is to be understood that each of such examples is extendable to an array with N rows and N−1 columns (where N is a natural number greater than 3). Furthermore, the present invention is applicable not merely to access requests in a memory unit but also to refresh requests and so forth. In addition, it is still possible to apply the invention to a time sharing system (TSS) employed in a large-sized computer or the like. Although this arbitrate circuit is formed principally in a chip, it may be used as a component of a system outside a chip.

The arbitrate circuit of the present invention has a gate array of N rows and N−1 columns with gate closing circuits, gate opening circuits and gate holding circuits, so that proper priority can be given sequentially to signals upon occurrence of three or more competitive signal processing requests, hence achieving satisfactory arbitration of competitive signal input with certainty.

With regard to other examples of the present invention relative to a reset pulse generator circuit for initializing a sequence circuit such as an arbitrate circuit, third through fifth embodiments will be described below with reference to the accompanying drawings.

Third Embodiment

Figure 11:
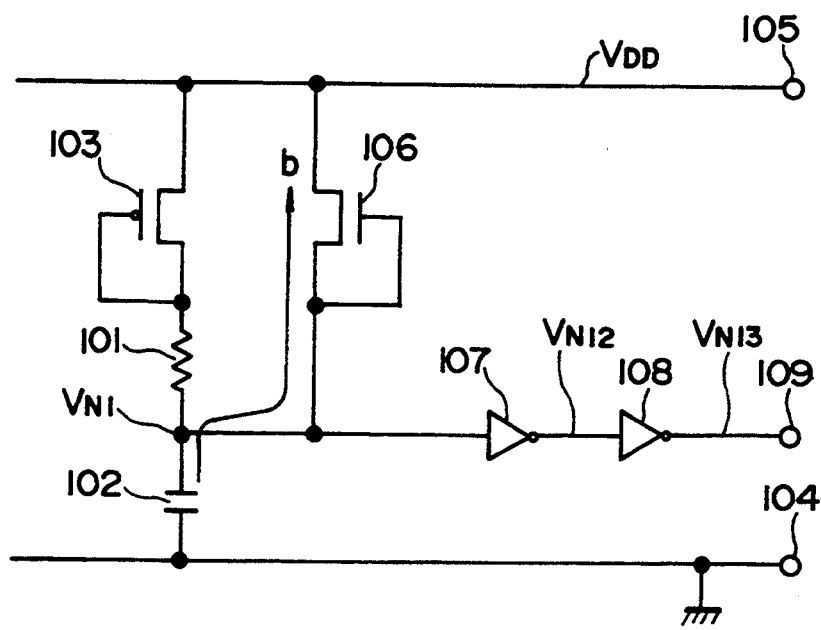
FIG. 11 is a connection diagram of a third embodiment according to the pre sent invention.

FIG. 11 is a connection diagram of a third embodiment according to the present invention, wherein one end of a resistor 101 and one end of a capacitor 102 are connected to each other, and the other end of the resistor 101 is connected to both the drain and the gate of a diode-connected P-channel MOS transistor 103. Meanwhile the source of the P-channel MOS transistor 103 is connected to a power supply terminal 105, and the other end of the capacitor 102 is connected to a ground terminal 104.

The junction between one end of the resistor 101 and one end of the capacitor 102 is connected to both the source and the gate of a diode-connected N-channel MOS transistor 106, and the drain of such MOS transistor 106 is connected to the power supply terminal 105.

The junction between one end of the resistor 101 and one end of the capacitor 102 is connected to the input of an inverter 107, whose output is connected to the input of another inverter 108. And the output of the inverter 108 is connected to an output terminal 109.

Figure 12:
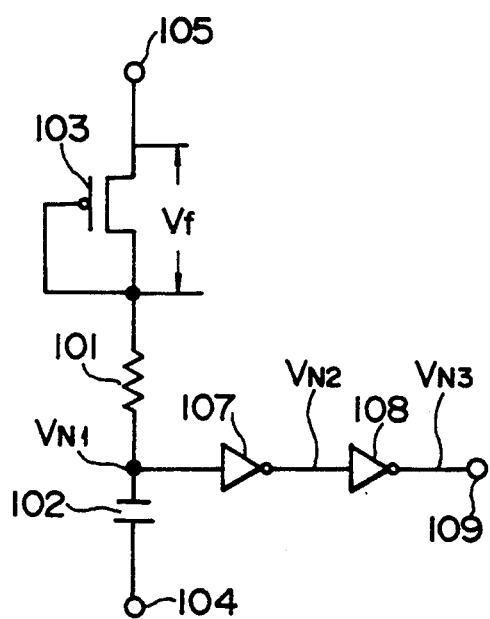
FIG. 12 is a connection diagram for explaining the third embodiment of the invention.

Thus, in the third embodiment of the present invention, a diode-connected P-channel MOS transistor 103 is disposed between the power supply terminal 105 and the resistor 101 as shown in FIG. 12. Therefore, the voltage applied to an integrator consisting of the resistor 101 and the capacitor 102 is shifted by a value corresponding to the threshold voltage $V_f$ of the P-channel MOS transistor 103.

Figure 13:
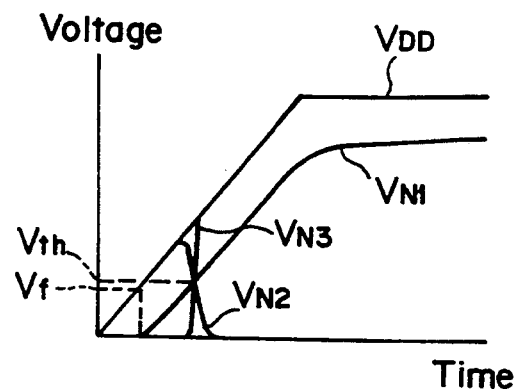
FIGS. 13 and 14 are graphic waveform charts for explaining the operation of the third embodiment.

Since the supply voltage $V_{DD}$ is extremely low immediately after switching on the power source as graphically shown in FIG. 13, the P-channel MOS transistor 103 is kept in its off-state.

Thereafter, as shown in FIG. 13, the supply voltage $V_{DD}$ rises in conformity with the time constant of the power circuit. And the P-channel MOS transistor 103 is turned on when the supply voltage $V_{DD}$ has risen beyond the threshold voltage $V_f$ of the MOS transistor 103.

Due to such turn-on of the P-channel MOS transistor 103, a charge current comes to flow in the resistor 101 via the P-channel MOS transistor 103 to consequently charge the capacitor 102. Therefore, the output voltage $V_{N1}$ at the junction of the resistor 101 and the capacitor 102 has reached the threshold voltage $V_{th}$ of the inverter 107, the output $V_{N2}$ of the inverter 107 is changed as shown in FIG. 13 to cause a change in the output $V_{N3}$ of the inverter 108.

Thus, after the power source is switched on, the capacitor 102 starts to be charged with a delay of the time required for the supply voltage $V_{DD}$ to reach the threshold voltage $V_f$ of the P-channel MOS transistor 103. Accordingly, even if the time constant of the integrator consisting of the resistor 101 and the capacitor 102 is smaller than the time constant of the power circuit, a reset pulse can be outputted properly after rise of the supply voltage to the predetermined value.

The diode-connected N-channel MOS transistor 106 is provided for outputting a reset pulse upon occurrence of any momentary power interruption. That is, when there occurs a momentary power interruption, the supply voltage $V_{DD}$ drops in conformity with the time constant of the power circuit. And when the supply voltage $V_{DD}$ has become lower than the voltage at the junction of the resistor 101 and the capacitor 102, the diode-connected N-channel MOS transistor 106 is turned on so that, as indicated by an arrow b in FIG. 11, the electric charge stored in the capacitor 102 is released therefrom via the N-channel transistor 6.

Since the electric charge in the capacitor 102 is thus released via the N-channel MOS transistor 106 in response to any momentary power interruption, the voltage $V_{N1}$ at the junction of the resistor 101 and the capacitor 102 falls below the threshold voltage $V_{th}$ of the inverter 107 upon recovery from the momentary power interruption, so that a reset pulse can be generated with certainty after restoration of the normal supply voltage.

The operation in the third embodiment of the present invention will be described below with reference to FIG. 14.

Figure 14:
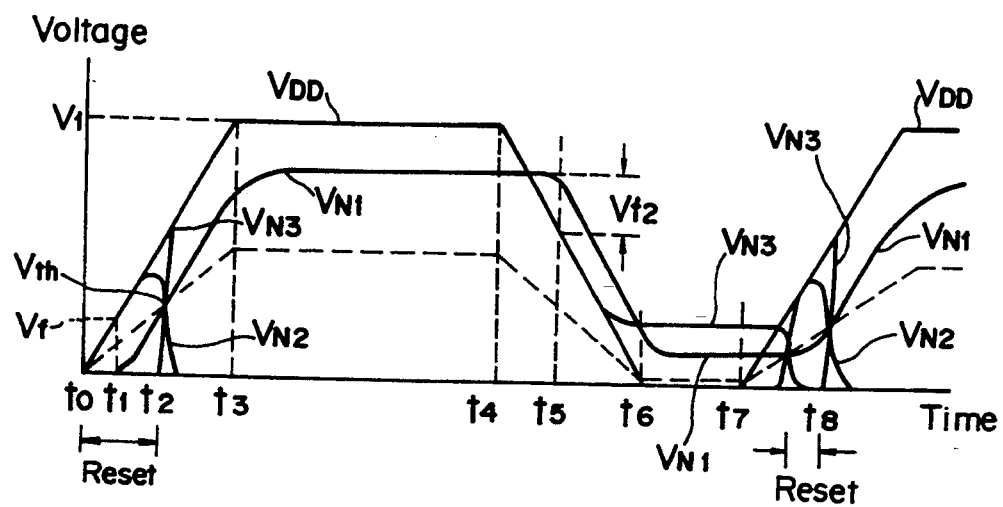

Suppose now that the power source is switched on at an instant $t_0$ in FIG. 14. Posterior to switching on the power source, the supply voltage $V_{DD}$ rises from 0 volt to the steady-state voltage $V_1$ in conformity with the time constant of the power circuit.

Since the supply voltage $V_{DD}$ is lower than the threshold voltage $V_f$ of the P-channel MOS transistor 103 immediately after the power switch-on instant, this MOS transistor 103 is in its off-state. Therefore, the transistor 103 is kept in such off-state during the time from the power switch-on instant $t_0$ to a subsequent instant $t_1$ where the supply voltage $V_{DD}$ reaches the threshold voltage $V_f$ of the P-channel MOS transistor 103, and the voltage $V_{N1}$ at the junction of the resistor 101 and the capacitor 102 is 0 volt as graphically shown in FIG. 14.

The P-channel MOS transistor 103 is turned on at the instant $t_1$ where the supply voltage $V_{DD}$ reaches the threshold voltage $V_f$ of the transistor 103. As a result, the capacitor 102 begins to be charged by the current flowing via the resistor 101, so that the voltage $V_{N1}$ at the junction of the resistor 101 and the capacitor 102 gradually rises as graphically shown in FIG. 14.

The output $V_{N2}$ of the inverter 107 is turned to a low level at an instant $t_2$ where the voltage $V_{N1}$ at the junction of the resistor 101 and the capacitor 102 exceeds the threshold value $V_{th}$ of the inverter 107, thereby turning the output $V_{N3}$ of the inverter 108 to a high level.

The output signal of the inverter 108 is obtained from the output terminal 109 so as to be used as a reset pulse. Therefore, the sequence circuit in the LSI is reset at the instant $t_2$ where the output $V_{N2}$ of the inverter 107 is turned to a low level and the output $V_{N3}$ of the inverter 108 is turned to a high level.

At a subsequent instant $t_3$, the supply voltage $V_{DD}$ reaches a steady-state voltage $V_1$ (e.g. 5 volts). And the voltage $V_{N1}$ at the junction of the resistor 101 and the capacitor 102 rises to the difference of $(V_{DD} - V_f)$. Since the steady-state supply voltage $V_{DD}$ is 5 volts and the threshold voltage $V_f$ is 0.8 volt for example, it follows that the voltage $V_{N1}$ at the junction of the resistor 101 and the capacitor 102 rises to 4.2 volts for example.

Suppose now that a momentary power interruption occurs at an instant $t_4$. Then the supply voltage $V_{DD}$ drops in conformity with the time constant of the power circuit, and subsequently becomes 0 volt at an instant $t_6$. When the supply voltage $V_{DD}$ has thus dropped to 0 volt due to the momentary power interruption, the sequence circuit is rendered unstable in the LSI posterior to recovery from the momentary power interruption, so that it becomes necessary to reset the sequence circuit in the LSI upon restoration of the normal power supply.

Meanwhile, immediately after occurrence of such momentary power interruption, electric charge is stored in the capacitor 102. And the N-channel MOS transistor 106 is in its off-state when the supply voltage $V_{DD}$ is above a certain level lower than the junction voltage $V_{N1}$ of the resistor 101 and the capacitor 102 by a value corresponding to the threshold voltage $V_{f2}$ of the N-channel MOS transistor 106. Consequently the electric charge is retained in the capacitor 102 and therefore any fast change is not induced in the voltage $V_{N1}$ at the junction of the resistor 101 and the capacitor 102.

The N-channel MOS transistor 106 is turned on at an instant $t_5$ where the supply voltage $V_{DD}$ drops to a certain level lower than the junction voltage $V_{N1}$ of the resistor 101 and the capacitor 102 by a value corresponding to the threshold voltage $V_{f2}$ of the N-channel MOS transistor 106. Due to such turn-on of the N-channel MOS transistor 106, the charge stored in the capacitor 102 is released therefrom via the N-channel MOS transistor 106, thereby starting a fast drop of the junction voltage $V_{N1}$ of the resistor 101 and the capacitor 102 at the instant $t_5$.

When the supply voltage $V_{DD}$ has become 0 volt at a next instant $t_6$, the junction voltage $V_{N1}$ of the resistor 101 and the capacitor 102 is at a level lower than the threshold voltage $V_{th}$ of the inverter 107.

Upon restoration of the normal power supply at an instant $t_7$, the supply voltage $V_{DD}$ rises from 0 volt to the steady-state voltage $V_1$ in conformity with the time constant of the power circuit. And also the capacitor 102 begins to be charged again upon restoration of the normal power supply, so that the junction voltage $V_{N1}$ of the resistor 101 and the capacitor 102 rises in conformity with the time constant determined by the resistance $R_{101}$ of the resistor 101 and the capacitance $C_{102}$ of the capacitor 102.

Subsequently at an instant $t_8$ where the junction voltage $V_{N1}$ of the resistor 101 and the capacitor 102 exceeds the threshold voltage $V_{th}$ of the inverter 107, the output $V_{N2}$ of the inverter 107 is turned to a low level while the output $V_{N3}$ of the inverter 8 is turned to a high level.

The output of the inverter 108 is obtained from an output terminal 109 so as to be used as a reset pulse. It follows therefore that, even after occurrence of any momentary power interruption, the sequence circuit in the LSI is reset at the instant $t_8$ where the output $V_{N2}$ of the inverter 107 is turned to a low level while the output $V_{N3}$ of the inverter 108 is turned to a high level posterior to restoration of the normal power supply.

Fourth Embodiment

Figure 15:
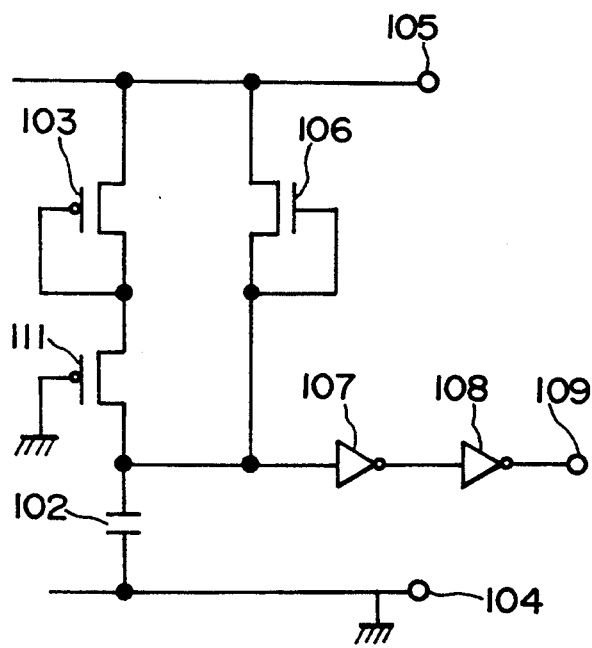
FIG. 15 is a connection diagram of a fourth embodiment according to the invention.

In a modification, the resistor 101 employed in the above-described third embodiment may be replaced with a MOS transistor 111 whose gate is grounded, as illustrated in FIG. 15.

Fifth Embodiment

Figure 16:
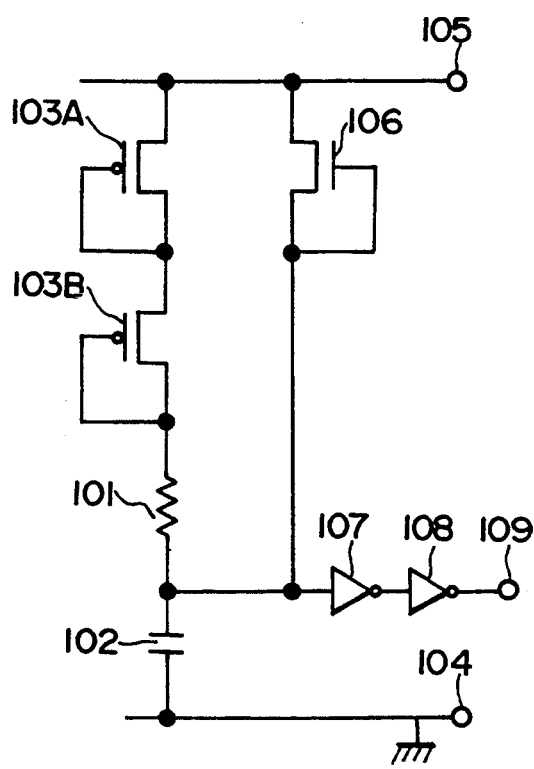
FIG. 16 is a connection diagram of a fifth embodiment according to the invention.
Figure 21:
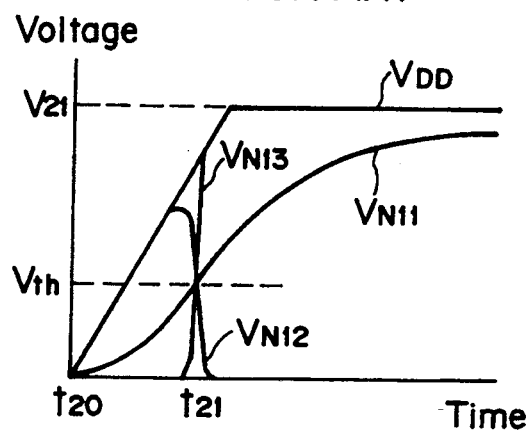
FIGS. 21 through 23 are graphic waveform charts for explaining the operation of the conventional internal pulse generator circuit.
Figure 22:
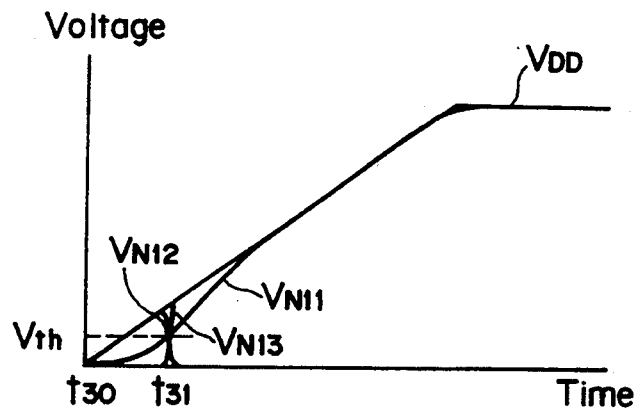
Figure 23:
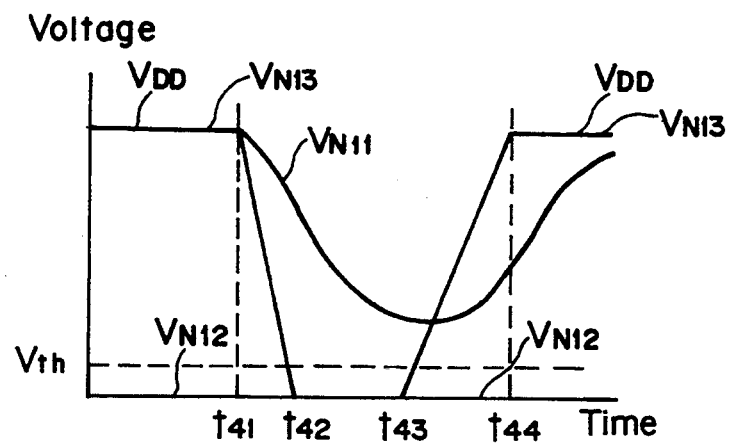

Furthermore, as illustrated in FIG. 16, two MOS transistors 103A and 103B may be connected in series between the power supply terminal 105 and the resistor 101. In this modified arrangement where a plurality of MOS transistors 103 are connected in series to each other between the power supply terminal 105 and the resistor 101, it becomes possible to adjust the delay time required until the capacitor 102 begins to be charged after the power source is switched on. In case n pieces of MOS transistors 103 are employed, charging the capacitor 102 is started when the supply voltage $V_{DD}$ satisfies the condition $V_{DD} > n \times V_f$.

According to the present invention, the diode-connected P-channel MOS transistor 103 is disposed between the power supply terminal 105 and the resistor 101 which partially constitutes an integrator. Therefore, the operation of charging the capacitor 102 is started after rise of the supply voltage $V_{DD}$ up to the threshold voltage $V_f$ of the P-channel MOS transistor 103 posterior to switching on the power source. Consequently, even when the time constant of the integrator consisting of the resistor 101 and the capacitor 102 is smaller than the time constant of the power circuit, a reset pulse can be outputted after complete rise of the supply voltage to a predetermined value. Thus, it becomes possible to eliminate the necessity of selecting a great time constant for the integrator which consists of the resistor 101 and the capacitor 102, hence requiring no external attachment of a resistor and a capacitor.

Furthermore, the diode-connected N-channel MOS transistor 106 is disposed between the power supply terminal 105 and the junction of the resistor 101 and the capacitor 102. Therefore, upon occurrence of any momentary power interruption, the supply voltage $V_{DD}$ drops in conformity with the time constant of the power circuit, and the diode-connected N-channel MOS transistor 106 is turned on when the supply voltage $V_{DD}$ has become lower than the voltage of the junction of the resistor 101 and the capacitor 102, whereby the electric charge stored in the capacitor 102 is released therefrom via the N-channel MOS transistor 106. Thus, the present invention is capable of coping with such momentary power interruption as well.

What is claimed is:

1. An arbitrate circuit included in a semiconductor integrated circuit and comprising:

N, (where N is a natural number equal to or greater than 3), input terminals for separately receiving a plurality of contending request signals;

N output terminals, corresponding to the N input terminals, at which the request signals input to the N input terminals are selectively output in accordance with a predetermined priority;

first, second, third, fourth, fifth and sixth AND gates, each having a separate output terminal, a separate non-inverting input terminal, and one or more inverting input terminals;

the first and fourth AND gates being connected in series between a first one of the N input terminals and a first one of the N output terminals;

the second and fifth AND gates being connected in series between a second one of the N input terminals and a second one of the N output terminals;

the third and sixth AND gates being connected in series between a third one of the N input terminals and third one of the N output terminals;

wherein the first through sixth AND gates each have output terminals, inverting input terminals and non-inverting input terminals, the output terminals of the first, second and third AND gates being respectively connected to the non-inverting input terminals of the fourth, fifth, and sixth AND gates, and the output terminals of the fourth, fifth and sixth AND gates being respectively connected to a different inverting input terminal of each of the other of the fourth, fifth and sixth AND gates;

first, second and third gate opening circuits for the first, second and third AND gates, the first, second and third gate opening circuits being comprised of seventh, eighth and ninth AND gates, each having an inverting input terminal respectively connected to the output terminal of the fourth, fifth and sixth AND gates, each having a non-inverting input terminal respectively connected to the output terminal of the first, second and third AND gates, and each having an output terminal;

first, second and third holding circuits for the first, second and third AND gates, the first, second and third holding circuits being comprised of tenth, eleventh, and twelfth AND gates, respectively, having output terminals which are respectively connected to the inverting input terminals of the first, second and third AND gates, having inverting input terminals which are respectively connected to the output terminals of the fourth, fifth and sixth AND gates, and having non-inverting input terminals;

first, second and third gate closing circuits for the first, second and third AND gates, respectively, the first, second and third gate closing circuits being comprised of first, second and third OR gates, respectively, having output terminals respectively connected to the non-inverting input terminals of the tenth, eleventh and twelfth AND gates, and wherein the first OR gate has an input terminal which is connected to the output terminal of the ninth AND gate and another input terminal which is connected to the output terminal of the eighth AND gate, the second OR gate has an input terminal which is connected to the output terminal of the seventh AND gate and another input terminal which is connected to the output terminal of the ninth AND gate, and the third OR gate has an input terminal which is connected to output terminal of the seventh AND gate and another input terminal which is connected to the output terminal of the eighth AND gate.

2. An arbitrate circuit included in a semiconductor integrated circuit and comprising:

N, (where N is a natural number equal to or greater than 3), input terminals for separately receiving a plurality of contending request signals;

N output terminals, corresponding to the N input terminals, at which the request signals input to the N input terminals are selectively output in accordance with a predetermined priority;

a plurality of gate circuits which are arrayed to form a matrix of rows numbered i=1 to i=N and columns numbered j=1 to j=N−1 in such a manner that N−1 gate circuits of a given row are connected in series between a different one of the N input terminals and the corresponding output terminal so as to pass a request signal, received at one of the N input terminals, successively through each of the series connected gate circuits of the row to the corresponding output terminal;

a plurality of gate blocking circuit means connected to the plurality of gate circuits and responsive to a passage of each request signal through a given gate circuit in an Ith row and a (J+1)th column of the matrix, provided I is an integer between 1 and N and J is an integer between 1 and (N−2), for blocking further passage, while a given one of the request signals passes through the given gate circuit, of any other contending request signals which are supplied to the gate circuits in the Ith row in the first column to a Jth column of the matrix;

a plurality of gate closing circuit means connected to the plurality of the gate circuits and each of which is responsive to a passage of each request signal through the given gate circuit for closing, until the given request signal has completely passed through the given gate circuit, the gate circuits of the matrix in the jth column in the rows other than the ith row and other than any row being blocked by the gate blocking circuit means; and a plurality of gate opening circuit means connected to the plurality of the gate circuits and each of which is responsive to a passage of each request signal through the given gate circuit for opening gate circuits closed by the gate closing circuit means in a (j−1)th column of the matrix, provided (j−1)≧1, in the rows other than the ith row of the matrix.

3. An arbitrate circuit according to claim 2, wherein N=3.

4. An arbitrate circuit according to claim 2, wherein
the gate circuits, the gate opening circuit means and the gate blocking circuit means are comprised of AND circuits; and
the gate closing circuit means are comprised of OR circuits.

5. An arbitrate circuit included in a semiconductor integrated circuit and comprising:

N, (where N is a natural number equal to or greater than 3), input terminals for separately receiving a plurality of contending request signals;

N output terminals, corresponding to the N input terminals, at which the request signals input to the N input terminals are selectively output in accordance with a predetermined priority;

a plurality of gate circuits which are arrayed to form a matrix of rows 1 to N and columns numbered 1 to N−1 in such a manner that N−1 gate circuits of a given row are connected in series between a different one of the N input terminals and the corresponding output terminal so as to pass a request signal, received at one of the N input terminals, successively through each of the series connected gate circuits of the row to the corresponding output terminal;

gate blocking circuit means connected to gate circuits in the given row and responsive to a passage of each request signal through a given gate circuit in the given row and a given column of the matrix, for blocking further passage, while a given one of the request signals passes through the given gate circuit, of any other contending request signals which are supplied to the gate circuits in the given row in the first column to the column immediately preceding the given column;

gate closing circuit means connected to the plurality of the gate circuits and which are responsive to a passage of each request signal through the given gate circuit for closing, until the given request signal has completely passed through the given gate circuit, the gate circuits of the matrix in the given column in the rows other than the given row and other than any row being blocked by the gate blocking circuit means;

gate opening circuit means connected to the plurality of the gate circuits and which are responsive to a passage of each request signal through the given gate circuit for opening gate circuits closed by the gate closing circuit means in a column immediately preceding the given column of the matrix in the rows other than the given row of the matrix; and wherein the given column can only be any column for the second to (N−1)th column.

* * * * *